(12) United States Patent
Yi et al.

(10) Patent No.: US 9,406,380 B2
(45) Date of Patent: Aug. 2, 2016

(54) ELECTRONIC DEVICE

(71) Applicant: SK hynix Inc., Icheon-Si (KR)

(72) Inventors: Jae-Yun Yi, Icheon-Si (KR);
Sung-Woong Chung, Icheon-Si (KR);
Seok-Pyo Song, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 75 days.

(21) Appl. No.: 14/444,922

(22) Filed: Jul. 28, 2014

(65) Prior Publication Data

US 2015/0248932 A1    Sep. 3, 2015

(30) Foreign Application Priority Data

Feb. 28, 2014    (KR) .................. 10-2014-0024508

(51) Int. Cl.
  *G11C 13/00* (2006.01)
  *G11C 11/16* (2006.01)
  *G11C 11/22* (2006.01)

(52) U.S. Cl.
  CPC ............ *G11C 13/004* (2013.01); *G11C 11/165* (2013.01); *G11C 11/1655* (2013.01); *G11C 11/1657* (2013.01); *G11C 11/1673* (2013.01); *G11C 11/2259* (2013.01); *G11C 13/0002* (2013.01); *G11C 13/003* (2013.01); *G11C 13/0023* (2013.01); *G11C 13/0026* (2013.01); *G11C 13/0028* (2013.01); *G11C 13/0069* (2013.01); *G11C 2013/0073* (2013.01); *G11C 2213/74* (2013.01); *G11C 2213/79* (2013.01)

(58) Field of Classification Search
  CPC ..................................................... G11C 13/004
  See application file for complete search history.

(56) References Cited

U.S. PATENT DOCUMENTS

| | | | | |
|---|---|---|---|---|
| 7,116,593 B2 * | 10/2006 | Hanzawa | ................. | G11C 7/12 257/E27.004 |
| 2005/0018474 A1 | 1/2005 | Sohn | | |
| 2011/0176350 A1 | 7/2011 | Jung et al. | | |
| 2011/0216616 A1 * | 9/2011 | Ko | ............ | G11C 7/06 365/207 |
| 2012/0230090 A1 * | 9/2012 | Takahashi | ............. | G11C 11/16 365/158 |
| 2013/0107606 A1 * | 5/2013 | Katoh | ................ | G11C 11/4125 365/148 |

FOREIGN PATENT DOCUMENTS

KR    20100052158 A    5/2010

* cited by examiner

*Primary Examiner* — Hoai V Ho
*Assistant Examiner* — Tri Hoang
(74) *Attorney, Agent, or Firm* — Perkins Coie LLP

(57) ABSTRACT

Provided is an electronic device including a semiconductor memory unit. The semiconductor memory unit may include: a storage cell comprising a variable resistance element; a first selecting element coupled to one end of the storage cell and having a threshold voltage set to a first voltage; and a second selecting element coupled to the other end of the storage cell and having a threshold voltage set to a second voltage higher than the first voltage.

20 Claims, 11 Drawing Sheets

ELECTRONIC DEVICE

CROSS-REFERENCE TO RELATED APPLICATIONS

This patent document claims priority of Korean Patent Application No. 10-2014-0024508, entitled "ELECTRONIC DEVICE" and filed on Feb. 28, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which differently sets threshold voltages of selecting elements at both ends of a storage cell, and reduces the total resistance of a path through which a read current is passed, thereby reducing leakage current while increasing margin.

In an implementation, there is provided an electronic device including a semiconductor memory unit. The semiconductor memory unit may include: a storage cell comprising a variable resistance element; a first selecting element coupled to one end of the storage cell and having a threshold voltage set to a first voltage; and a second selecting element coupled to the other end of the storage cell and having a threshold voltage set to a second voltage higher than the first voltage.

In some implementations, the storage cell comprises: the resistance variable element; and a selecting element coupled to one end of the resistance variable element and turned on/off in response to a voltage of a word line. In some implementations, the semiconductor memory unit include a word line to supply a control voltage. In some implementations, the storage cell may further include a selecting element coupled to one end of the variable resistance element and coupled to the word line to receive the control voltage so that the variable resistance element is turned on or off in response to the control voltage of the word line.

In some implementations, the electronic device may pass a read current from the first selecting element to the second selecting element during a read operation.

In some implementations, the variable resistance element may have a first state with a first resistance value or a second state with a second resistance value higher than the first reference value.

In some implementations, the variable resistance element may be switched to the first state when a first switching current is passed from the other end to the one end, and switched to the second state when a second switching current higher than the first switching current is passed from the one end to the other end. In some implementations, the variable resistance element is switched between the first state and the second state depending on a switching current flowing through the variable resistance element.

In some implementations, the first selecting element and the second selecting element may be turned on or off in response to a select signal.

In some implementations, the first selecting element and the second selecting element may be fabricated to have the threshold voltages of the first voltage and the second voltage, respectively. In some implementations, the second voltage is higher than the first voltage and can reduce a leakage current following through the variable resistance element when the first and second selecting elements are turned off.

In some implementations, the first and second selecting elements are fabricated in such a manner that a distance between gates of the second selecting elements is larger than a distance between gates of the first selecting elements. In some implementations, the first selecting element includes two first transistors adjacent to each other and the second selecting element includes two second transistors adjacent to each other, and a distance between gates of the two second transistors in the second selecting element is larger than a distance between gates of the two first transistors in the first selecting element.

In some implementations, an active region of the second selecting element may have a higher doping concentration than an active region of the first selecting element.

In some implementations, a gate of the second selecting element may have a larger width than a gate of the first selecting element.

In some implementations, a distance between a gate and a contact coupled to an active region of the second selecting element may be larger than a distance between a gate and a contact coupled to an active region of the first selecting element.

In some implementations, the first selecting element may receive a back bias voltage such that the threshold voltage becomes the first voltage, and the second selecting element may receive a back bias voltage such that the threshold voltage becomes the second voltage.

In some implementations, the variable resistance element includes one or more of structures having a metal oxide, a phase change material, and a tunnel barrier layer interposed between two magnetic layers.

In another aspect, an electronic device is provided to include a semiconductor memory unit that includes: a first global line; a second global line; one or more cell arrays each including a plurality of storage cells, each storage cell having a variable resistance element coupled to, a first local line and a second local line; one or more first selecting elements coupled between the first global line and the first local lines of a corresponding cell array and having a threshold voltage set to a first voltage; and one or more second selecting elements coupled between the second global line and the second local line of a corresponding cell arrays and having a threshold voltage set to a second voltage higher than the first voltage. In another aspect, an electronic device is provided to include a semiconductor memory unit that includes: a first global line; a second global line; one or more cell arrays each including a plurality of storage cells, each storage cell having a variable resistance element coupled to a first local line and a second local line; one or more first selecting elements coupled between the first global line and the first local line of a corresponding cell array and having a threshold voltage set to a first voltage; and one or more second selecting elements coupled between the second global line and the second local line of a corresponding cell arrays and having a threshold voltage set to a second voltage higher than the first voltage to reduce a leakage current in a storage cell when first and second selecting elements corresponding to the storage cell are turned off.

In some implementations, the storage cell may further include: a selecting element coupled to one end of the variable resistance element and a corresponding word line, and turned on or off in response to a voltage of the corresponding word line.

In some implementations, the electronic device may pass a current from the first global line to the second global line through a selected storage cell during a read operation.

In some implementations, the variable resistance element may have a first state with a first resistance value or a second state with a second resistance value higher than the first reference value.

In some implementations, the variable resistance element may be switched to the first state when a first switching current is passed from the other end to the one end, and switched to the second state when a second switching current larger than the first switching current is passed from the one end to the other end. In some implementations, the variable resistance element is switched between the first state and the second state depending on a switching current flowing through the variable resistance element.

In some implementations, the first selecting element and the second selecting element may be turned on or off in response to a corresponding select signal.

In some implementations, the first selecting element and the second selecting element may be fabricated to have the threshold voltages of the first voltage level and the second voltage, respectively.

In some implementations, the first selecting element may receive a back bias voltage such that the threshold voltage becomes the first voltage level, and the second selecting element may receive a back bias voltage such that the threshold voltage becomes the second voltage level.

In some implementations, the variable resistance element may include one or more of structures having a metal oxide, a phase change material, and a tunnel barrier layer interposed between two magnetic layers.

In some implementations, the electronic device may further include a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device may further include a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device may further include a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device may further include a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

In another aspect, a method of operating an electronic device comprising a semiconductor memory unit is provided to include: providing a semiconductor memory unit including a storage cell coupled between a first selecting element having a first threshold voltage and a second selecting element having a second threshold voltage; and configuring the first selecting element and the second selecting element so that the second threshold voltage is higher than the first threshold voltage to reduce a leakage current in the semiconductor memory unit when first and second selecting elements are turned off.

In some implementations, the method may further include: supplying different read voltages to the first selecting element and the second selecting element.

In some implementations, the method may further include: providing a switching current in a direction that changes depending on data to be written; and supplying a lower voltage to the selecting element having a higher threshold voltage than the other.

DETAILED DESCRIPTION

Various examples and implementations of the disclosed technology are described below in detail with reference to the accompanying drawings.

Semiconductor devices in accordance with implementations may include a variable resistance element. The variable resistance element may exhibit a variable resistance characteristic and include a single layer or multilayer. For example, the variable resistance element may include a material used in RRAM, PRAM, MRAM, FRAM or the like, for example, a chalcogenide compound, a transition metal compound, a ferroelectric substance, a ferromagnetic substance or the like. However, the present implementations are not limited thereto, but the variable resistance element may include other materials as long as they have a variable resistance characteristic of switching between different resistance states according to a voltage or current applied across them.

More specifically, the variable resistance element may include metal oxide. For example, the metal oxide may include transition metal oxide, such as nickel (Ni) oxide, titanium (Ti) oxide, hafnium (Hf) oxide, zirconium (Zr) oxide, tungsten (W) oxide, or cobalt (Co) oxide, and a perovskite-based material such as STO (SrTiO) or PCMO (PrCaMnO). The variable resistance element may exhibit a characteristic of switching between different resistance states through formation/disappearance of a current filament depending on the behavior of vacancies.

The variable resistance element may include a phase change material. The phase change material may include a chalcogenide material such as GST (Ge—Sb—Te), for example. The variable resistance element may be stabilized to any one of the crystalline state and the amorphous state by heat, and exhibit a characteristic of switching between different resistance states.

The variable resistance element may have a structure in which a tunnel barrier layer is interposed between two magnetic layers. The magnetic layer may be formed of NiFeCo, CoFe or the like, and the tunnel barrier layer may be formed of $Al_2O_3$ or the like. The variable resistance element may exhibit a characteristic of switching between different resistance states according to the magnetization directions of the two magnetic layers. For example, when the magnetization directions of the magnetic layers are parallel to each other, the variable resistance element may have a low resistance state, and when the magnetization directions of the magnetic layers are anti-parallel to each other, the variable resistance element may have a high resistance state.

Figure 1:
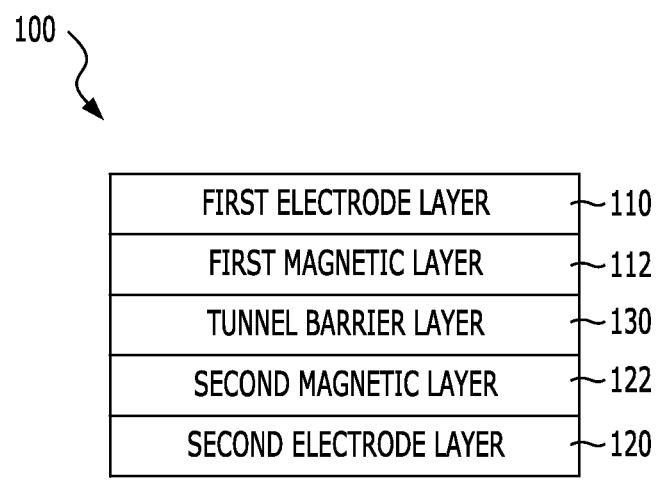
FIG. 1 is a diagram illustrating a magnetic tunnel junction (MTJ) which is one of structures having a tunnel barrier layer interposed between two magnetic layers.

FIG. 1 is a diagram illustrating a magnetic tunnel junction (MTJ) which is one of structures having a tunnel barrier layer interposed between two magnetic layers.

Referring to FIG. 1, the MTJ 100 may include a first electrode layer 110 serving as a top electrode, a second electrode layer serving as a bottom electrode, first and second magnetic layers 112 and 122, and a tunnel barrier layer 130 formed between the pair of magnetic layers 112 and 122.

The first magnetic layer 112 may include a free ferromagnetic layer of which the magnetization direction is varied according to the direction of a current applied to the MTJ 100, and the second magnetic layer 122 may include a pinned ferromagnetic layer of which the magnetization direction is pinned.

The MTJ 100 may store data 0 or 1 while the resistance value thereof is changed according to the current direction.

Figure 2A:
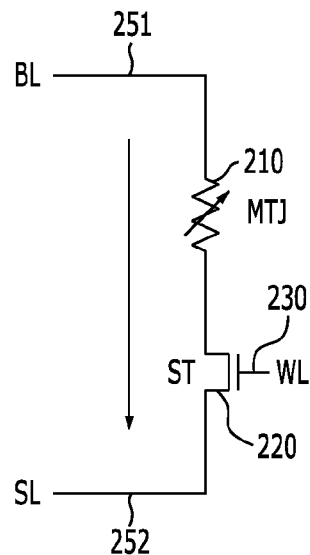
FIGS. 2A and 2B are diagrams for explaining the principle that data is stored in a variable resistance element 210.
Figure 2B:
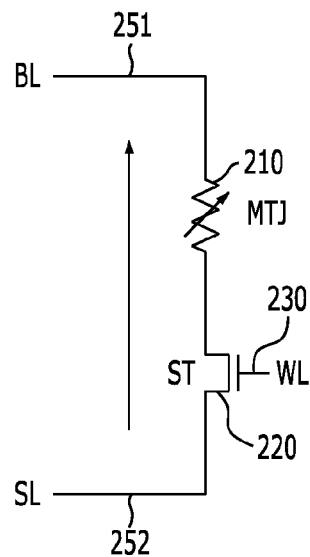

FIGS. 2A and 2B are diagrams for explaining the principle that data is stored in a variable resistance element 210. The variable resistance element 210 may include the MTJ 100 described with reference to FIG. 1.

FIG. 2A is a diagram for explaining the principle that low data is written to the variable resistance element 210. In order to select the variable resistance element 210 to store data, a word line 230 coupled to the variable resistance element 210 may be enabled to turn on a transistor 220. Then, when a current is passed from one end 251 to the other end 252, that is, from the first electrode layer 110 serving as the top electrode of the MTJ 100 to the second electrode layer 120 serving as the bottom electrode in FIG. 1 (arrow direction), the magnetization direction of the first magnetic layer 112 serving as a free ferromagnetic layer and the magnetization direction of the second magnetic layer 122 serving as a pinned ferromagnetic layer may become parallel to each other, and the variable resistance element 210 may have a low resistance state. When the variable resistance element 210 has a low resistance state, it may be defined that low data is stored in the variable resistance element 210.

FIG. 2B is a diagram for explaining the principle that high data is written to the variable resistance element 210. Similarly, the word line 230 coupled to the variable resistance element 210 may be enabled to turn on the transistor 220. Then, when a current is passed from the other end 252 to the one end 251, that is, from the second electrode layer 120 to the first electrode layer 110 (arrow direction), the magnetization direction of the first magnetic layer 112 and the magnetization direction of the second magnetic layer 122 may become anti-parallel to each other, and the variable resistance element 210 may have a high resistance state. When the variable resistance element 210 has a high resistance state, it may be defined that high data is stored in the variable resistance element 210.

Figure 3:
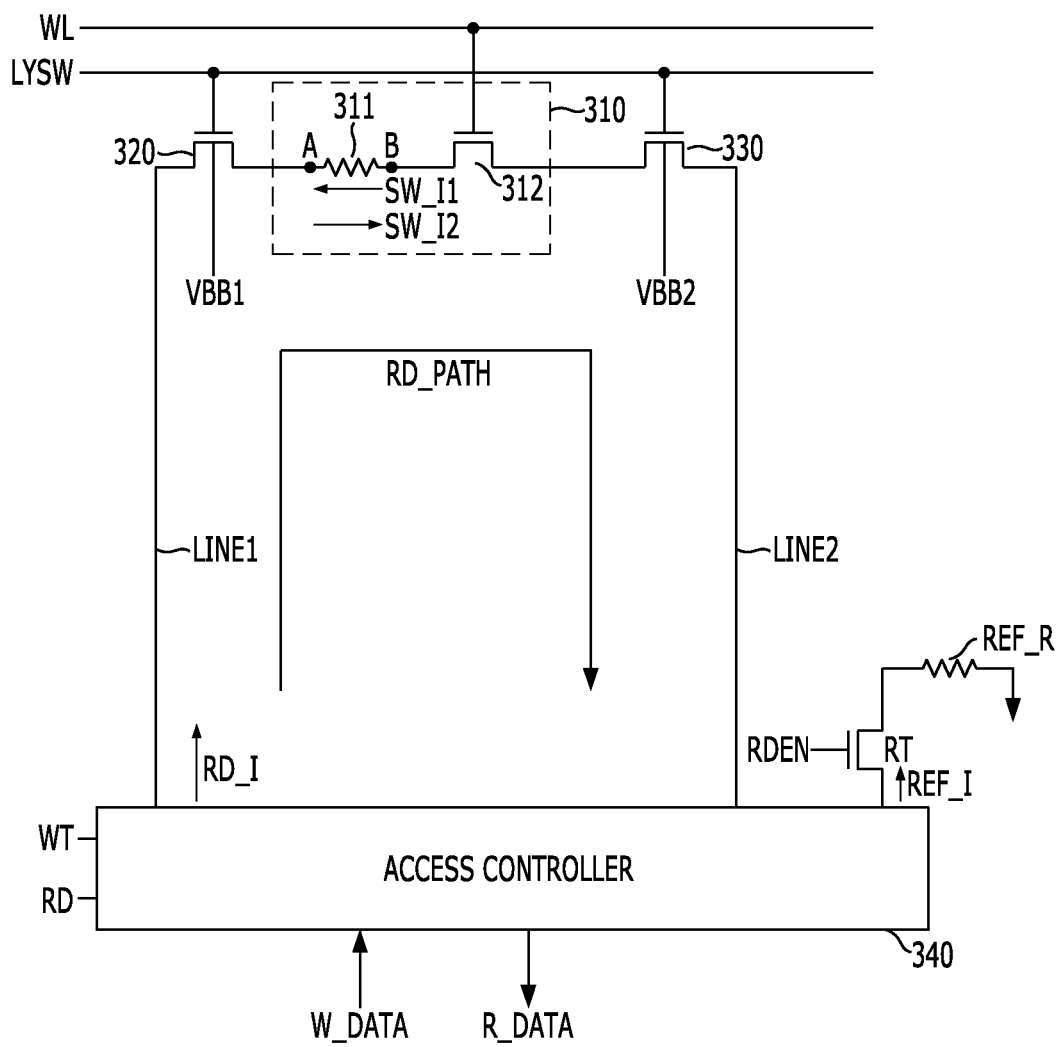
FIG. 3 is a configuration diagram of a memory circuit (device) which includes a storage cell 310 having a variable resistance element 311.

FIG. 3 is a configuration diagram of a memory circuit (device) which includes a storage cell 310 having a variable resistance element 311.

Referring to FIG. 3, the memory circuit may include a storage cell 310, a first selecting element 320, a second electing element 330, an access controller 340, a word line WL, a first line LINE1, a second line LINE2, and a reference resistance element REF_R.

The storage cell 310 may include a variable resistance element 311 and a selecting element 312 inside the storage cell 310. The variable resistance element 311 may have two different resistance states and operate to switch between the two states in response to a switching current flowing across the variable resistance element 311. The variable resistance element 311 may have different resistance values for the two states, respectively. For example, the variable resistance element 311 may have first and second resistance values in first and second states, respectively. In one implementation, the second resistance value may be higher than the first resistance value. The variable resistance element 311 may be switched to the first state when a first switching current SW_I1 flows in a direction from B to A. The variable resistance element 311 may be switched to the second state when a second switching current SW_I2 larger than the first switching current SW_I1 flows in a direction from A to B.

The first state may correspond to the above-described low resistance state, and the second state may correspond to the above-described high resistance state. The first state of the variable resistance element 311 may be defined as a state in which low data is stored, and the second state of the variable resistance element 311 may be defined as a state in which high data is stored. Alternatively, the first state of the variable resistance element 311 may be defined as a state in which high data is stored, and the second state of the variable resistance element 311 may be defined as a state in which low data is stored. In the descriptions hereafter, the former case will be taken as an example.

The selecting element 312 may be coupled to a word line WL, and controlled in response to the voltage of the word line WL. The selecting element 312 may be turned on in response to the voltage of the word line WL when the word line WL is activated, and turned off in response to the voltage of the word line WL when the word line WL is pre-charged (deactivated).

Both ends of the storage cell 310 may be coupled to the first and second selecting elements 320 and 330, respectively. The storage cell 310 may be coupled to the first line LINE1 through the first selecting element 320, and coupled to the second line LINE2 through the second selecting element 330. The first line LINE1 and the second line LINE2 may be coupled to the access controller 340. The first selecting element 320 and the second selecting element 330 may be turned on when a select signal LYSW is enabled, and turned off when the select signal LYSW is disabled. The first selecting element 320 may have a threshold voltage set to a first voltage, and the second selecting element 330 may have a threshold voltage set to a second voltage higher than the first voltage. As such, the first and second selecting elements 320 and 330 may have different levels of threshold voltages.

The first and second selecting elements 320 and 330 may be fabricated to have different levels of the threshold voltages. For example, the first selecting element 320 may be fabricated to set its threshold voltage to the first voltage level, and the second selecting element 330 may be fabricated to set its threshold voltage to the second voltage level higher than the first voltage level.

If MOS transistors are used for the first and second selecting elements 320, the threshold voltages of the first and second selecting elements 320 and 330 may be controlled in various manners. For example, the threshold voltages may be varied by adjusting the gate widths of the transistors, adjusting the doping concentrations of the drains or sources of the transistors, changing doping elements doped into the drains or sources, or changing the doping concentration or doping element of a substrate in which the transistors are formed. In addition, the threshold voltages of the first and second selecting elements 320 and 330 may be controlled during the fabrication process through various methods. In case of using other elements instead of the MOS transistors for the first and second selecting elements 320 and 330, the first and second selecting elements 320 and 330 can be fabricated to have different threshold voltages at the fabrication stage through various methods.

The levels of back bias voltages VBB1 and VBB2 may be controlled in such a manner that the threshold voltage of the first selecting element 320 is set to the first voltage and the threshold voltage of the second selecting element 330 is set to the second voltage higher than the first voltage.

For example, when the first and second selecting elements 320 and 330 are implemented with NMOS transistors, the first back bias voltage VBB1 applied to the bulk of the first selecting element 320 may be set lower than the second back bias voltage VBB2 applied to the bulk of the second selecting element 330. In this case, when the first and second selecting elements 320 and 330 were fabricated through the same method or have the same threshold voltage, the threshold voltage of the second selecting element 330 may be set higher than the threshold voltage of the first selecting element 320. If the first and second selecting elements 320 and 330 are implemented with other elements instead of NMOS transistors, the first and second selecting elements 320 and 330 may be set to have different threshold voltages through various methods after fabrication.

The reference resistance element REF_R may have a resistance value between the first and second resistance values, and may be coupled to the access controller 340 through a coupling element RT. The coupling element RT is turned on or off in response to a read enable signal RDEN which is enabled during a read operation.

When a write signal WT is enabled, the access controller 340 provides a switching current to the storage cell 310 in a direction which is set by write data W_DATA. For example, when low data is to be written, the access controller 340 may apply a high voltage and a low voltage to the second line LINE2 and the first line LINE1, respectively. In this case, the first switching current SW_I1 flows from the second line LINE2 to the first line LINE1 through the selected storage cell 310. When high data is to be written, the access controller 340 may apply a high voltage and a low voltage to the first line LINE1 and the second line LINE2, respectively. In this case, the second switching current SW_I2 flows from the first line LINE1 to the second line LINE2 through the selected storage cell 310.

When a read signal RD is enabled, the access controller 340 may compare the resistance value of the variable resistance element 311 of the storage cell 310 with the resistance value of the reference resistance element REF_R, read data stored in the storage cell 310, and output the read data R_DATA. For example, when the first state indicates that low data is stored and the second state indicates that high data is stored, the access controller 340 may output low data as the read data R_DATA when the resistance value of the variable resistance element 311 is lower than the resistance value of the reference resistance element REF_R, and output high data as the read data R_DATA when the resistance value of the variable resistance element 311 is higher than the resistance value of the reference resistance element REF_R.

For this operation, when the read signal Rd is enabled, the access controller 340 may apply a high voltage and a low voltage to the first line LINE1 and the second line LINE2, respectively. Thus, a read current RD_I flows from the first line LINE1 to the second line LINE2 through the storage cell 310, and a reference current REF_I flows through the reference resistance element REF_R.

In general, the leakage current flowing through the transistor when a transistor is turned off may cause a few problems. For example, an error may occur in an operation of a memory, or current consumption and power consumption of the memory may increase. Such problems can be avoided by increasing the threshold voltage of the transistor. If the threshold voltage of the transistor is increased, the leakage current is reduced, the precision and reliability of the memory may be improved, and the current consumption and power consumption of the memory may be reduced. When the threshold voltage of the transistor increases, an equivalent resistance value of the transistor may increase as well. For the case of the above-described memory, the data stored in the storage cell 310 may be determined based on the resistance value of the variable resistance element 311 of the storage cell 310. Thus, in order to increase read margin, other resistance elements except the variable resistance element needs to be reduced as much as possible in the path RD PATH through which the read current RD_I flows. Therefore, when the threshold voltages of the first and second selecting elements 320 and 330 are increased to reduce leakage current, the read margin of the memory may decrease.

In the memory of FIG. 3, by setting the threshold voltages of the first and second selecting elements 320 and 330 differently from each other, leakage current may be reduced and read margin can be secured at the same time. The memory of FIG. 3 provides different threshold voltages for the first and second selecting elements 320 and 330, by increasing the threshold voltage of the second selecting element 330 only. By doing so, the read margin can be secured as much as possible. The leakage current may flow through the first and second selecting elements 320 and 330. Thus, by increasing the threshold voltage of the selecting element 330 only, it is still possible to obtain the same effect as when the threshold voltages of the two selecting elements 320 and 330 are increased. Hereafter, the effects of the memory of FIG. 3 will be described in detail with reference to FIGS. 4A to 4C.

Figure 4A:
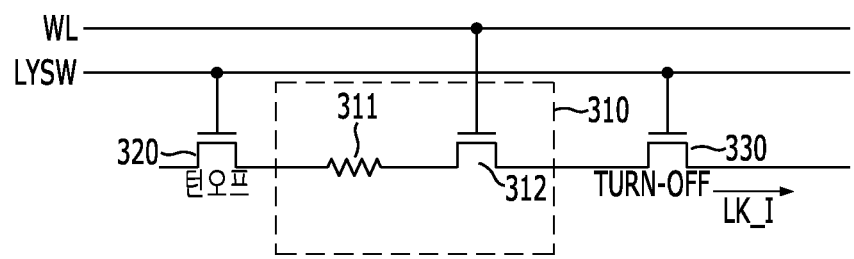
FIGS. 4A to 4C are diagrams partially illustrating the electronic device of FIG. 3, in order to describe the effect of the memory of FIG. 3.
Figure 4B:
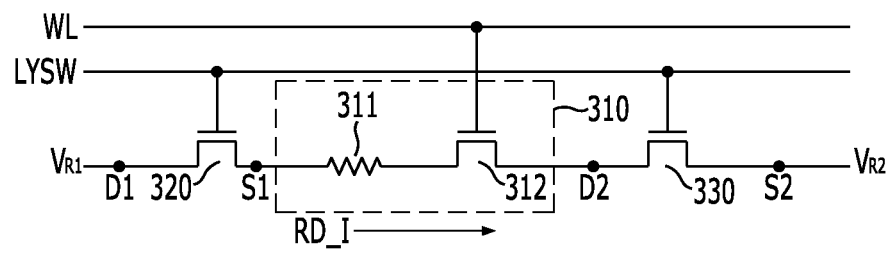
Figure 4C:
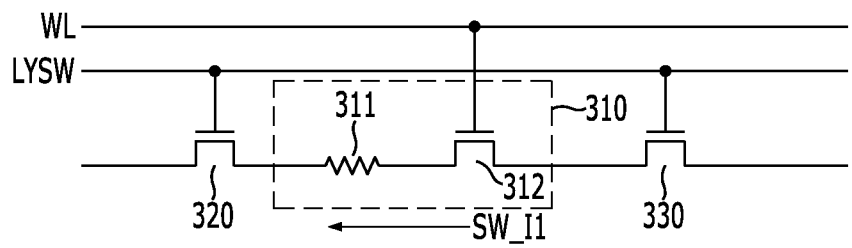
Figure 4C:
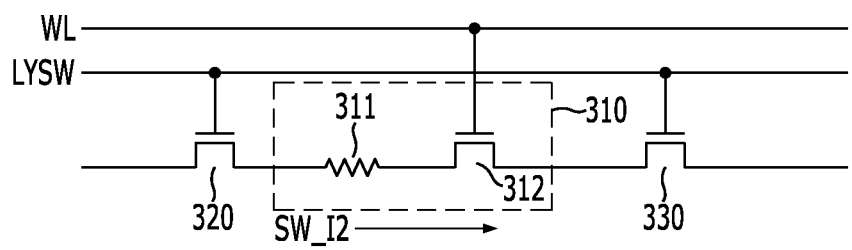

FIGS. 4A to 4C are diagrams partially illustrating the electronic device of FIG. 3. Referring to FIGS. 4A to 4C, the effects of the memory of FIG. 3 are explained.

In FIGS. 4A to 4C, a part of the memory includes the storage cell 310, the first selecting element 320, and the second selecting element 330. FIG. 4A illustrates when the selecting elements 320 and 330 of the storage cell 310 are turned off, FIG. 4B illustrates when a read operation is performed, and FIG. 4C illustrates when a write operation is performed. Referring to FIGS. 4A to 4C, the relation between the threshold voltages of the selecting elements 320 and 330 and the current flowing through the variable resistance element will be described.

In the following descriptions, the select signal LYSW has the voltage, $V_{LYSW}$, when enabled, the word line WL has the voltage, $V_{WL}$, when activated, the first selecting element 320 has the threshold voltage, $V_{T1}$, and the second selecting element 330 has the threshold voltage, $V_{T2}$.

As illustrated in FIG. 4A, when the first and second selecting elements 320 and 330 are turned off, the four elements including the first selecting element 320, the variable resistance element 311, the selecting element 312, and the second selecting element 330 are coupled in series. In this case, the amount of the current flowing through the four elements including the first selecting element 320, the variable resistance element 311, the selecting element 312, and the second selecting element 330 may be set by a particular element among the four elements, through which the smallest amount of current flows. Thus, the threshold voltage of the second selecting element 330 may be raised to reduce the leakage current LK_I. Namely, the undesired leakage current LK_I can be effectively reduced by increasing the threshold voltage of the second selecting element 330 only rather than increasing threshold voltages of the both first and second selecting elements 320 and 330.

FIG. 4B shows a memory performing a read operation. As illustrated in FIG. 4B, when the memory performs a read operation, a first read voltage $V_{R1}$ may be applied to the drain D1 of the first selecting element 320, and a second read voltage $V_{R2}$ may be applied to the source S2 of the second selecting element 330. The first read voltage $V_{R1}$ may have a higher level than the second read voltage $V_{R2}$. In some implementations, the second read voltage $V_{R2}$ may have a value of a base voltage VSS or ground voltage GND. In the below, the voltage of the source S1 of the first selecting element 320 and the voltage of the drain D2 of the second selecting element 330 are represented by $V_{S1}$ and $V_{S2}$, respectively.

When the word line WL is activated, the selecting element 312 may be turned on, and when the select signal LYSW is enabled, the first and second selecting element 320 and 330 may be turned on to provide the read current RD_I from the drain D1 of the first selecting element 320 to the source S2 of the selecting element 330.

In the case of an NMOS transistor, a current $I_D$ flowing across the NMOS transistor may satisfy the relation $(V_{GS}-V_T)^2 \propto I_D$, where $V_{GS}$ represents a difference between the gate voltage and the source voltage of the transistor, and $V_T$ represents a threshold voltage. In FIG. 4B, the read current RD_I flows from the source S1 of the first selecting element 320 to the source S2 of the second selecting element 330. Since a voltage drop occurs, the voltage value at the source S2 becomes smaller than that at the source S1, $V_{S1}$. As a result, $V_{GS}$ of first selecting element 320 which is obtained by the equation, $V_{LYSW}-V_{S1}$ is less than $V_{GS}$ of second selecting element 330 which is obtained by the equation, $V_{LYSW}-V_{S2}$. When the second selecting element 330 has a greater voltage difference $V_{GS}$ than the first selecting element 320, the reduction of the read current RD_I can be minimized by increasing the threshold voltage $V_{T2}$ of the second selecting element. In this case, the resistance elements that exist along the path of the read current RD_I except for the variable resistance element 311 may be minimized to maintain read margin. That is, it is possible to reduce leakage current while securing read margin as much as possible by increasing the threshold voltage of the selecting element having the lower read voltage between $V_{R1}$ and $V_{R2}$ applied.

FIG. 4C shows the memory performing a write operation for two different cases. In case 1 of FIG. 4C, the write data W_DATA having low value is applied, the variable resistance element 311 is switched to the first state, and the first switching current SW_I1 may flow from the second selecting element 330 to the first selecting element 320. In case 2 of FIG. 4C, the write data W_DATA having high value is applied, the variable resistance element 311 is switched to the second state, and the second switching current SW_I2 may flow from the first selecting element 320 to the second selecting element 330. The amount of the second switching current SW_I2 may be larger than that of the first switching current SW_I1. As described with reference to FIG. 4B, if increasing the threshold voltage of the selecting element having a relatively low voltage applied, the equivalent resistance of the relevant part is effectively reduced and a high current can flow. Thus, it is possible to improve the efficiency of the write operation by providing a lower voltage to the second selecting element 330 than the first selecting element 320, when the second selecting element 330 has a higher threshold voltage and the second switching current SW_I2 is larger than the switching currents SW_I1.

Figure 5:
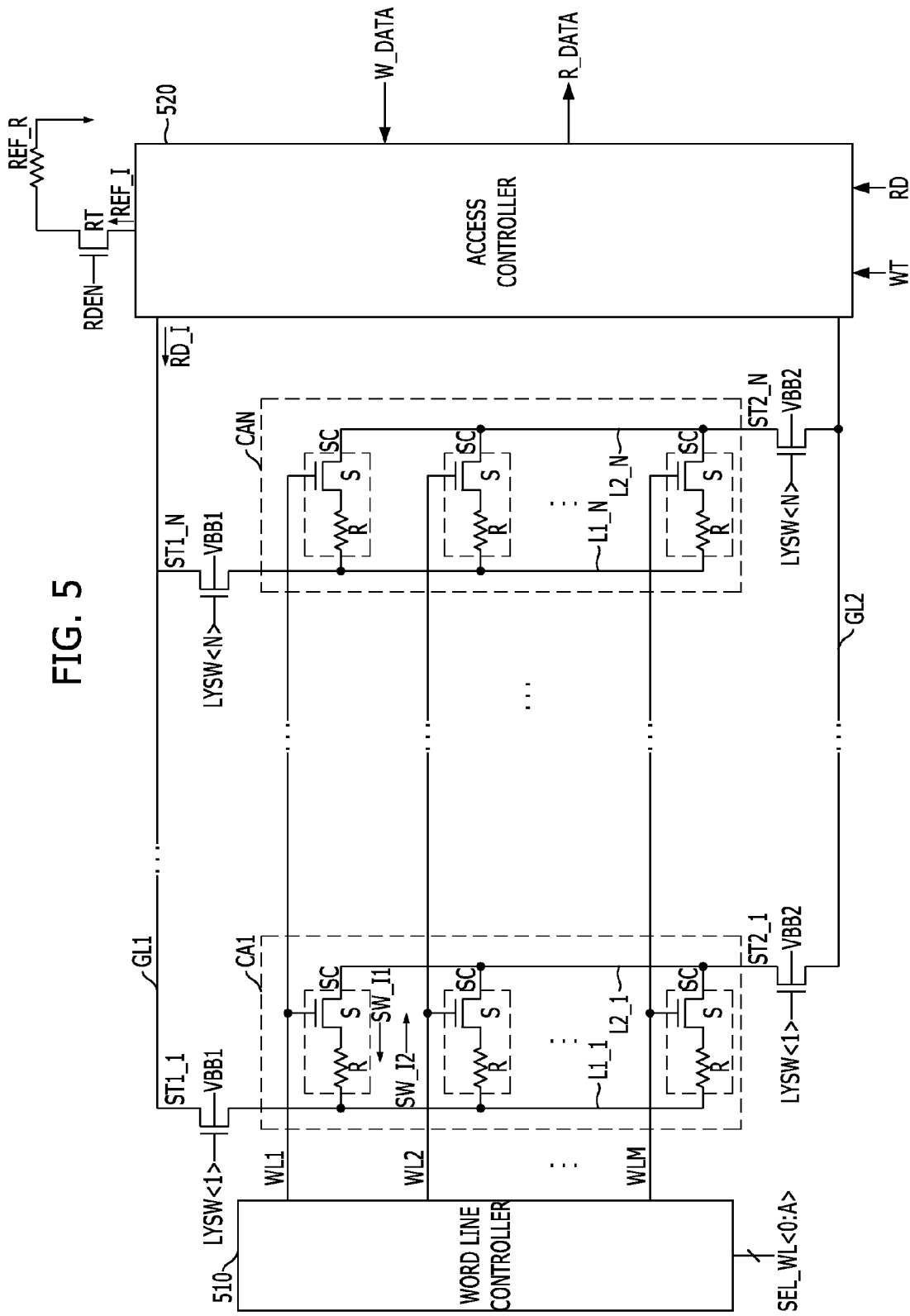
FIG. 5 is a configuration diagram of a memory circuit (device) which includes a plurality of storage cells SC each having a variable resistance element R.

FIG. 5 is a configuration diagram of a memory circuit (device) which includes a plurality of storage cells SC each having a variable resistance element R.

As illustrated in FIG. 5, the memory circuit may include one or more cell arrays CA1 to CAN, a first global line GL1, a second global line GL2, one or more first selecting elements ST1_1 to ST1_N, one or more second selecting elements ST2_1 to ST2_N, a plurality of word lines WL1 to WLN, a reference resistance element REF_R, a word line controller 510, and an access controller 520.

The one or more cell arrays CA1 to CAN may include a plurality of storage cells SC, first local lines L1_1 to L1_N, and second local lines L2_1 to L2_N, respectively. Each of the storage cells SC may include a variable resistance element R and a selecting element S. The variable resistance element R may have two different states and operate to switch between the two states in response to a switching current flowing across the variable resistance element R. The variable resistance element R may have different resistance values for two states, respectively. More specifically, the variable resistance element R may have a first resistance value in a first state and a second resistance value higher than the first resistance value in a second state. The variable resistance element R may be switched to the first state when a first switching current SW_I1 flows, and switched to the second state when a second switching current SW_I2 higher than the first switching current SW_I1 flows.

The first state may correspond to the above-described low resistance state, and the second state may correspond to the above-described high resistance state. The first state of the variable resistance element R may be defined as a state in which low data is stored therein, and the second state of the variable resistance element R may be defined as a state in which high data is stored therein. Alternatively, the first state of the variable resistance element R may be defined as a state in which high data is stored therein, and the second state of the variable resistance element R may be defined as a state in which low data is stored therein. In the descriptions below, the former case that low data and high data are respectively stored in the first and the second states will be assumed.

The selecting element S of each storage cell SC may be coupled to a corresponding word line of the word lines WL1 to WLM. The selecting element S is turned on when the corresponding word line is activated, and turned off when the corresponding word line is pre-charged (deactivated). One end of the storage cell SC may be coupled to a corresponding first local line of the first local lines L1_1 to L1_N, and the other end of the storage cell SC may be coupled to a corresponding second local line of the second local lines L2_1 to L2_N.

The first local lines L1_1 to L1_N may be coupled to the first global line GL1 through the first selecting elements ST1_1 to ST1_N, respectively, and the second local lines L2_1 to L2_N may be coupled to the second global line GL2 through the second selecting elements ST2_1 to ST2_N, respectively. The first selecting elements ST1_1 to ST1_N and the second selecting elements ST2_1 to ST2_N may be turned on when a corresponding select signal is enabled among select signals LYSW<1:N>.

The threshold voltages of the first selecting elements ST1_1 to ST1_N and the second selecting elements ST2_1 to ST2_N may have different levels. As described with reference to FIG. 3, the first selecting elements ST1_1 to ST1_N and the second selecting elements ST2_1 to ST2_N may be fabricated such that the threshold voltages thereof are different from each other. Alternatively, the threshold voltages of the first selecting elements ST1_1 to ST1_N and the second selecting elements ST2_1 to ST2_N may be set differently by adjusting back bias voltages VBB1 and VBB2. The threshold voltage of the first selecting elements ST1_1 to ST1_N may be set to a first voltage, and the threshold voltage of the second selecting elements ST2_1 to ST2_N may be set to a second voltage higher than the first voltage.

The word line controller 510 may activate a selected word line among the plurality of word lines WL1 to WLM in response to word line selection information SEL_WL<0:A>. The word line controller 510 may apply a voltage for turning on selecting elements S coupled to the selected word line.

The reference resistance element REF_R may have a resistance value between the first and second resistance values, and may be coupled to the access controller 520 through a coupling element RT. The coupling element RT may be turned on or off in response to a read enable signal RDEN which is enabled during a read operation.

The access controller 520 may provide a switching current to a selected storage cell SC in a direction which is set by write data W_DATA, when a write signal WT is enabled. For example, when low data is to be written, the access controller 520 may apply a high voltage and a low voltage to the second global line GL2 and the first global line GL1, respectively, such that the first switching current SW_I1 is passed from the second global line GL2 to the first global line GL1 through the selected storage cell SC. Furthermore, when high data is to be written, the access controller 520 may apply a high voltage and a low voltage to the first global line GL1 and to the second global line GL2, respectively, such that the second switching current SW_I2 flows from the first global line GL1 to the second global line GL2 through the selected storage cell SC.

When a read signal RD is enabled, the access controller 520 may compare the resistance value of the variable resistance element R of the selected storage cell SC to the resistance value of the reference resistance element REF_R, determine data stored in the selected storage cell SC, and output the determined data R_DATA. For example, when it is defined that the first state indicates that low data is stored and the second state indicates that high data is stored, the access controller 520 may output low data as the read data R_DATA in case where the resistance value of the variable resistance element R of the selected storage cell SC is lower than the resistance value of the reference resistance element REF_R, and may output high data as the read data R_DATA in case where the resistance value of the variable resistance element R of the selected storage cell SC is higher than the resistance value of the reference resistance element REF_R.

For this operation, the access controller 520 may apply a high voltage and a low voltage to the first global line GL1 and the second global line GL2, respectively, when the read signal RD is enabled. Then, a read current RD_I may flow from the first global line GL1 to the second global line GL2 through the storage cell SC, and a reference current REF_I may flow to the reference resistance element REF_R.

The read/write operation for the selected storage cell SC may be performed in the same manner as explained for the storage cell 310 of FIG. 3. The first and second global lines GL1 and GL2 of FIG. 5 may correspond to the first and second lines LINE1 and LINE2 of FIG. 3, respectively. In the case of unselected cell arrays, leakage current may be effectively reduced because the second selecting elements ST2_1 to ST2_N have a high threshold voltage. Furthermore, by increasing the threshold voltage of the second selecting elements ST2_1 to ST2_N, which are coupled to the second global line GL2 driven at a relatively lower voltage during the read/write operation, it is possible to secure the read margin as much as possible and efficiently provide the switching current during a write operation.

Figure 6:
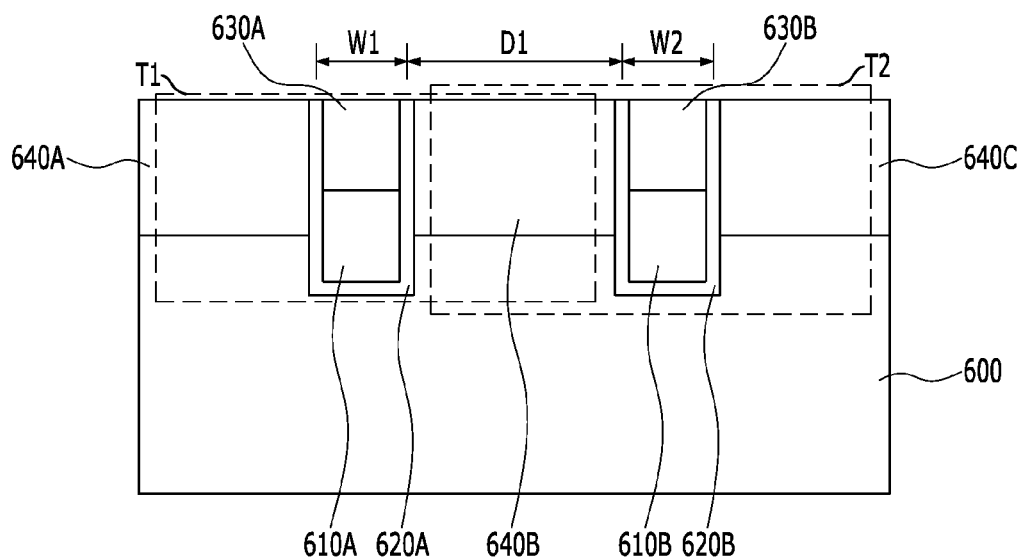
FIG. 6 is a cross-sectional view of a transistor with a buried gate.
Figure 7:
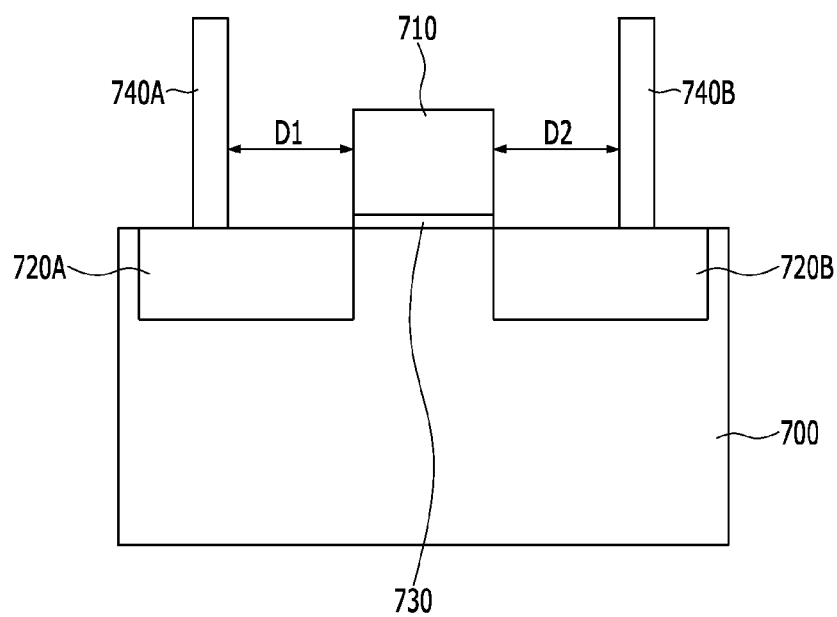
FIG. 7 is a cross-sectional view of a transistor.

FIGS. 6 and 7 are diagrams for explaining a method for fabricating the first and second selecting elements 320 and 330 to have different threshold voltages. In FIGS. 6 and 7, the first and second selecting elements 320 and 330 are MOS transistors.

FIG. 6 is a cross-sectional view of a transistor with a buried gate.

FIG. 6 illustrates two transistors having buried gates 610A and 610B which share an active region 640B. As illustrated in FIG. 6, the transistors T1 and T2 may share the active region 640B. Around the gates 610A and 610B, gate dielectric layers 620A and 620B may be respectively formed. Over the gates 610A and 610B, gate passivation layers 630A and 630B may be respectively formed. The transistors T1 and T2 may be formed on a substrate 600.

The threshold voltage of the transistors T1 and T2 may depend on a distance D1 between the gates 610A and 610B. More specifically, the threshold voltage of the transistors T1 and T2 may increase as the distance D1 between the gates 610A and 610B decreases, and decrease as the distance D1 between the gates 610A and 610B increases.

When the transistors T1 and T2 are the first selecting element 320 (or corresponds to 'ST1_1' and 'ST1_2', respectively), the transistors T1 and T2 may be fabricated to have a relatively large distance D1 therebetween, and when the transistors T1 and T2 are the second selecting element 320, the transistors T1 and T2 may be fabricated to have a relatively small distance D1 therebetween. The threshold voltage of the second selecting element 330 (or corresponds to 'ST2_1' and 'ST2_2', respectively) may be set higher than the threshold voltage of the first selecting element 320.

The threshold voltage of the transistors T1 and T2 may depend on the doping concentration of active regions 640A, 640B, and 640C. More specifically, the threshold voltage of the transistors T1 and T2 may increase with the increase in doping concentration of the active regions 640A, 640B, and 640C, and decrease with the decrease in doping concentration of the active regions 640A, 640B, and 640C.

When the transistors T1 and T2 are the first selecting element 320, the doping concentration of the active regions 640A, 640B, and 640C may increase, and when the transistors T1 and T2 are the second selecting element 330, the doping concentration of the active regions 640A, 640B, and 640C may decrease. The threshold voltage of the second selecting element 330 may be set higher than the threshold voltage of the first selecting element 320.

The threshold voltage of the transistors T1 and T2 may depend on the widths W1 and W2 of the gates 610A and 620B. More specifically, the threshold voltage of the transistors T1 and T2 may increase with the increase in widths W1 and W2 of the gates 610A and 620B, and decrease with the decrease in widths W1 and W2 of the gates 610A and 620B.

When the transistors T1 and T2 are the first selecting element 320, the transistors T1 and T2 may be fabricated to have relatively small widths W1 and W2, and when the transistors T1 and T2 are the second selecting element 330, the transistors T1 and T2 may be fabricated to have relatively large widths W1 and W2. The threshold voltage of the second selecting element 330 may be set higher than the threshold voltage of the first selecting element 320.

FIG. 7 is a cross-sectional view of a transistor.

FIG. 7 illustrates one transistor having a gate 710. As illustrated in FIG. 7, the transistor may be formed over a substrate 700. Furthermore, a gate dielectric layer 730 may be formed under the gate 710, and active regions 720A and 720B may be coupled to other components (not illustrated) through corresponding contacts 740A and 740B.

The transistor may have a threshold voltage which varies depending on distances D1 and D2 between the gate 710 and one of the contacts 740A and 740B. More specifically, the threshold voltage of the transistor may increase with the increase in distances D1 and D2 between the gate 710 and one of the contacts 740A and 740B, and decrease with the decrease in distances D1 and D2 between the gate 710 and one of the contacts 740A and 740B.

When the transistors T1 and T2 are the first selecting element 320, the transistors T1 and T2 may be fabricated to have relatively small distances D1 and D2, and when the transistors T1 and T2 are the second selecting element 330, the transistors T1 and T2 may be fabricated to have relatively large distances D1 and D2. The threshold voltage of the second selecting element 330 may be set higher than the threshold voltage of the first selecting element 320.

In accordance with the above-described implementations, since the threshold voltages of the selecting elements coupled to both ends of the storage cell are different from each other, the total resistance of the path along which the read/write current flows may be reduced to increase margin while reducing leakage current. Thus, it is possible to increase the operating speed and precision of the electronic device and reduce leakage current.

The above and other memory circuits or semiconductor devices based on the disclosed technology can be used in a range of devices or systems. FIGS. 8-12 provide some examples of devices or systems that can implement the memory circuits disclosed herein.

Figure 8:
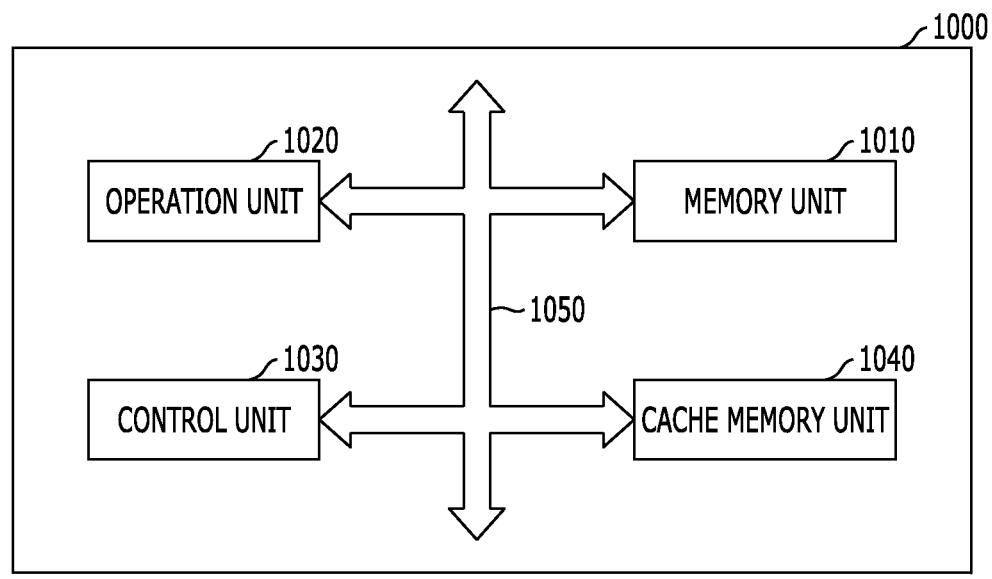
FIG. 8 is an example of configuration diagram of a microprocessor implementing memory circuitry based on the disclosed technology.

FIG. 8 shows an example of a configuration diagram of a microprocessor based on one implementation of the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 implementation may include a storage cell including a variable resistance element; a first selecting element coupled to one end of the storage cell and having a threshold voltage set to a first voltage; and a second selecting element coupled to the other end of the storage cell and having a threshold voltage set to a second voltage higher than the first voltage. Through this, a write/read margin of the memory unit 1010 may be increased, and current and power consumption of the memory unit 1010 may be decreased by decreasing leakage current. Consequently, operation speed and stability of the microprocessor 1000 may be improved, and current and power consumption of microprocessor 1000 may be decreased.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
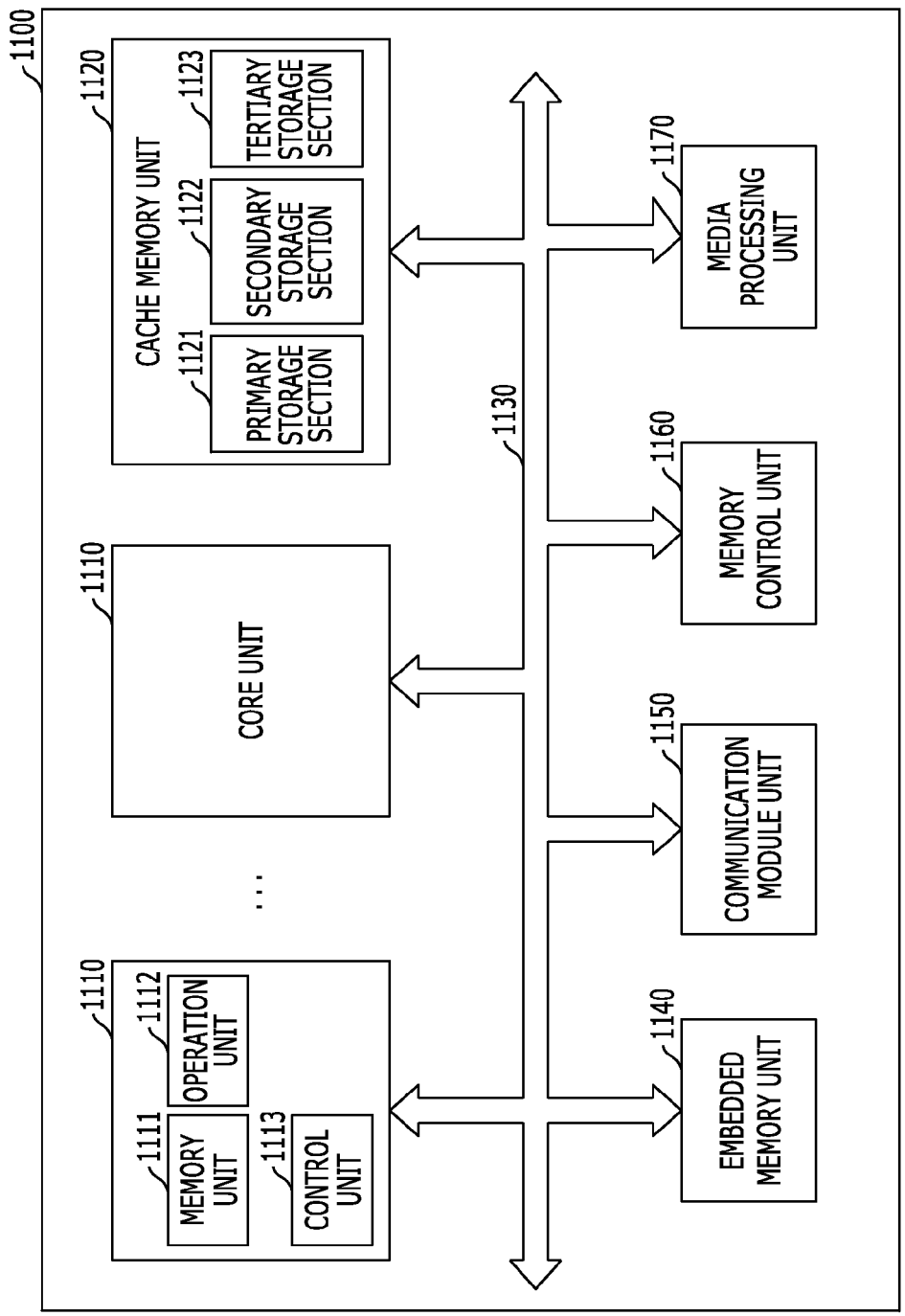
FIG. 9 is an example of configuration diagram of a processor implementing memory circuitry based on the disclosed technology.

FIG. 9 is a configuration diagram of a processor based on one implementation of the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include a storage cell including a variable resistance element; a first selecting element coupled to one end of the storage cell and having a threshold voltage set to a first voltage; and a second selecting element coupled to the other end of the storage cell and having a threshold voltage set to a second voltage higher than the first voltage. Through this, a write/read margin of the cache memory unit 1120 may be increased, and current and power consumption of the cache memory unit 1120 may be decreased by decreasing leakage current. Consequently, operation speed and stability of the processor 1100 may be improved, and current and power consumption of processor 1100 may be decreased.

Although it was shown in FIG. 9 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
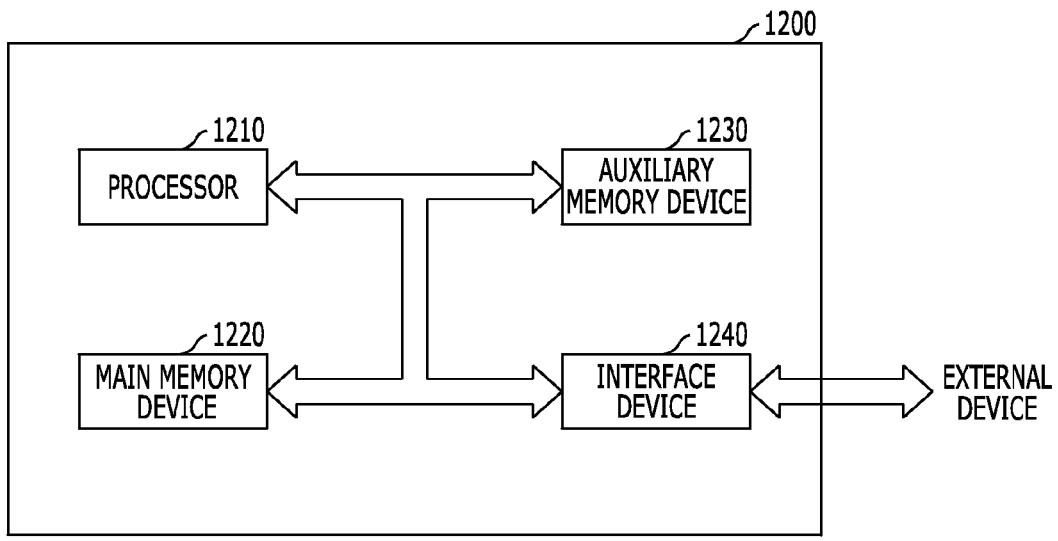
FIG. 10 is an example of configuration diagram of a system implementing memory circuitry based on the disclosed technology.

FIG. 10 is a configuration diagram of a system based on one implementation of the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a storage cell including a variable resistance element; a first selecting element coupled to one end of the storage cell and having a threshold voltage set to a first voltage; and a second selecting element coupled to the other end of the storage cell and having a threshold voltage set to a second voltage higher than the first voltage. Through this, a write/read margin of the main memory device 1220 may be increased, and current and power consumption of the main memory device 1220 may be decreased by decreasing leakage current. Consequently, operation speed and stability of the system 1200 may be improved, and current and power consumption of system 1200 may be decreased.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a storage cell including a variable resistance element; a first selecting element coupled to one end of the storage cell and having a threshold voltage set to a first voltage; and a second selecting element coupled to the other end of the storage cell and having a threshold voltage set to a second voltage higher than the first voltage. Through this, a write/read margin of the auxiliary memory device 1230 may be increased, and current and power consumption of the auxiliary memory device 1230 may be decreased by decreasing leakage current. Consequently, operation speed and stability of the system 1200 may be improved, and current and power consumption of system 1200 may be decreased.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
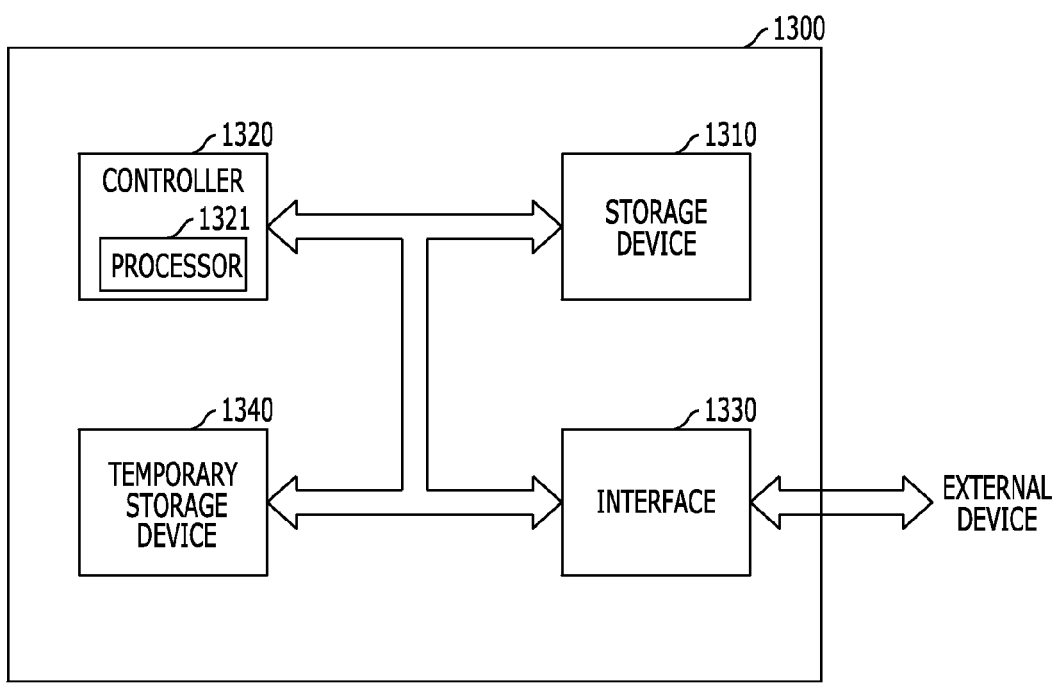
FIG. 11 is an example of configuration diagram of a data storage system implementing memory circuitry based on the disclosed technology.

FIG. 11 is a configuration diagram of a data storage system based on one implementation of the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. For example, the temporary storage device 1340 implementation for temporarily storing data may include a storage cell including a variable resistance element; a first selecting element coupled to one end of the storage cell and having a threshold voltage set to a first voltage; and a second selecting element coupled to the other end of the storage cell and having a threshold voltage set to a second voltage higher than the first voltage. Through this, a write/read margin of the temporary storage device 1340 may be increased, and current and power consumption of the temporary storage device 1340 may be decreased by decreasing leakage current. Consequently, operation speed and stability of the data storage system 1300 may be improved, and current and power consumption of data storage system 1300 may be decreased.

Figure 12:
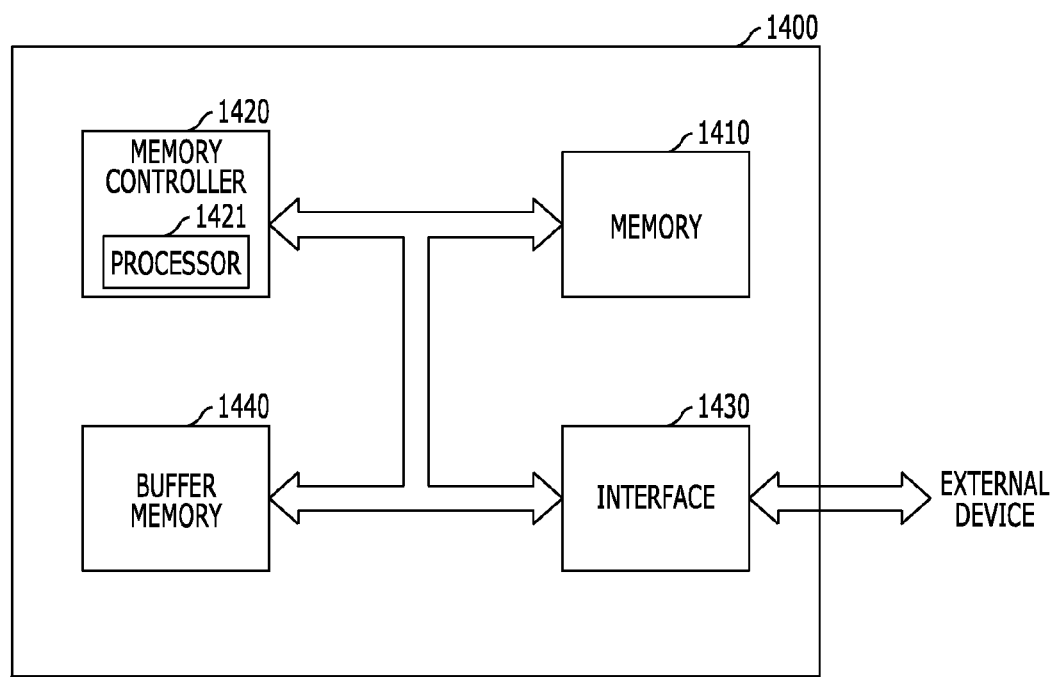
FIG. 12 is an example of configuration diagram of a memory system implementing memory circuitry based on the disclosed technology.

FIG. 12 is a configuration diagram of a memory system based on one implementation of the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a storage cell including a variable resistance element; a first selecting element coupled to one end of the storage cell and having a threshold voltage set to a first voltage; and a second selecting element coupled to the other end of the storage cell and having a threshold voltage set to a second voltage higher than the first voltage. Through this, a write/read margin of the memory 1410 may be increased, and current and power consumption of the memory 1410 may be decreased by decreasing leakage current. Consequently, operation speed and stability of the memory system 1400 may be improved, and current and power consumption of memory system 1400 may be decreased.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 implementation may include a storage cell including a variable resistance element; a first selecting element coupled to one end of the storage cell and having a threshold voltage set to a first voltage; and a second selecting element coupled to the other end of the storage cell and having a threshold voltage set to a second voltage higher than the first voltage. Through this, a write/read margin of the buffer memory 1440 may be increased, and current and power consumption of the buffer memory 1440 may be decreased by decreasing leakage current. Consequently, operation speed and stability of the memory system 1400 may be improved, and current and power consumption of memory system 1400 may be decreased.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

The invention claimed is:

1. An electronic device comprising a semiconductor memory unit,
   wherein the semiconductor memory unit comprises:
   a storage cell comprising a variable resistance element;
   a first selecting element coupled to one end of the storage cell and having a threshold voltage set to a first voltage;
   a second selecting element coupled to the other end of the storage cell and having a threshold voltage set to a second voltage higher than the first voltage,
   one or more additional storage cells, each comprising a variable resistance element;
   one or more additional first selecting elements corresponding to the one or more additional storage cells, respectively, each additional first selecting element coupled to a first end of the corresponding additional storage cell and having a threshold voltage set to the first voltage; and
   one or more additional second selecting elements corresponding to the one or more additional storage cells, respectively, each additional second selecting element coupled to a second end of a corresponding additional storage cell and having a threshold voltage set to the second voltage.

2. The electronic device of claim 1, comprising a word line to supply a control voltage, wherein the storage cell further comprises a selecting element coupled to one end of the variable resistance element and coupled to the word line to receive the control voltage so that the variable resistance element is turned on or off in response to the control voltage of the word line.

3. The electronic device of claim 1, wherein the electronic device passes a read current from the first selecting element to the second selecting element during a read operation.

4. The electronic device of claim 1, wherein the variable resistance element has a first state with a first resistance value or a second state with a second resistance value higher than the first resistance value.

5. The electronic device of claim 4, wherein the variable resistance element is switched to the first state when a first switching current is passed from the other end to the one end, and switched to the second state when a second switching current higher than the first switching current is passed from the one end to the other end.

6. The electronic device of claim 1, wherein the first selecting element and the second selecting element are turned on or off in response to a select signal.

7. The electronic device of claim 1, wherein the first selecting element and the second selecting element are fabricated to have the threshold voltages of the first voltage and the second voltage, respectively.

8. The electronic device of claim 1, wherein a distance between gates of two adjacent the second selecting element is larger than a distance between gates of two adjacent the first selecting element.

9. The electronic device of claim 7, wherein an active region of the second selecting element has a higher doping concentration than an active region of the first selecting element.

10. The electronic device of claim 7, wherein a gate of the second selecting element has a larger width than a gate of the first selecting element.

11. The electronic device of claim 7, wherein a distance between a gate and a contact coupled to an active region of the second selecting element is larger than a distance between a gate and a contact coupled to an active region of the first selecting element.

12. The electronic device of claim 1, wherein the first selecting element receives a back bias voltage such that the threshold voltage becomes the first voltage, and the second selecting element receives a back bias voltage such that the threshold voltage becomes the second voltage.

13. An electronic device comprising a semiconductor memory unit,
    wherein the semiconductor memory unit comprises:
    a first global line;
    a second global line;
    one or more cell arrays each including a plurality of storage cells, each storage cell having a variable resistance element, a first local line coupled to one ends of the storage cells, and a second local line coupled to the other ends of the storage cells;
    one or more first selecting elements coupled between the first global line and the first local line of the corresponding cell array and having a threshold voltage set to a first voltage; and
    one or more second selecting elements coupled between the second global line and the second local line of a corresponding cell arrays and having a threshold voltage set to a second voltage higher than the first voltage.

14. The electronic device of claim 13, wherein the storage cell further comprises:
    a selecting element coupled to one end of the variable resistance element and a corresponding word line, and turned on or off in response to a voltage of the corresponding word line.

15. The electronic device of claim 14, wherein the electronic device passes a current from the first global line to the second global line through a selected storage cell during a read operation.

16. The electronic device of claim 13, wherein the variable resistance element has a first state with a first resistance value or a second state with a second resistance value higher than the first resistance value.

17. The electronic device of claim 16, wherein the variable resistance element is switched to the first state when a first switching current is passed from the other end to the one end, and switched to the second state when a second switching current larger than the first switching current is passed from the one end to the other end.

18. The electronic device of claim 13, wherein the first selecting element and the second selecting element are turned on or off in response to a corresponding select signal.

19. The electronic device of claim 13, wherein the first selecting element and the second selecting element are fabricated to have the threshold voltages of the first voltage and the second voltage, respectively.

20. The electronic device of claim 13, wherein the first selecting element receives a back bias voltage such that the threshold voltage becomes the first voltage level, and the second selecting element receives a back bias voltage such that the threshold voltage becomes the second voltage level.

* * * * *